United States Patent [19]

Brosig et al.

[11] Patent Number: 5,571,363
[45] Date of Patent: Nov. 5, 1996

[54] METHOD FOR REDUCING THE FREQUENCY-TEMPERATURE SHIFT OF PIEZOELECTRIC CRYSTALS

[75] Inventors: Jill A. Brosig, Downers Grove; Matt Laurich, Elgin, both of Ill.

[73] Assignee: Motorola, Inc., Schaumburg, Ill.

[21] Appl. No.: 515,419

[22] Filed: Aug. 15, 1995

Related U.S. Application Data

[62] Division of Ser. No. 268,001, Jun. 29, 1994, Pat. No. 5,473,216.

[51] Int. Cl.$^6$ .................................................. H01L 41/22
[52] U.S. Cl. .................. 156/292; 29/25.35; 156/330; 310/346; 427/100; 427/265
[58] Field of Search .......................... 156/292, 60, 291, 156/290, 310, 330; 228/175; 29/25.35, 830, 829; 427/96, 100, 261, 265; 310/346, 348

[56] References Cited

U.S. PATENT DOCUMENTS

| | | | |
|---|---|---|---|
| 2,106,143 | 1/1938 | Williams | 427/100 X |
| 4,661,192 | 4/1987 | McShane | 156/292 |
| 5,405,476 | 4/1995 | Knecht | 156/292 |

FOREIGN PATENT DOCUMENTS

| | | |
|---|---|---|
| 3-88373 | 4/1991 | Japan . |
| 6-132754 | 5/1994 | Japan . |

*Primary Examiner*—Michael W. Ball
*Assistant Examiner*—Francis J. Lorin
*Attorney, Agent, or Firm*—Gary J. Cunningham; Brian M. Mancini

[57] ABSTRACT

A method and device for selectively reducing the frequency-temperature shift of piezoelectric crystals. The piezoelectric device (100) includes a substrate (102), a piezoelectric element (106) and a temperature dependent interface structure (120) for beneficially stressing the piezoelectric element at a predetermined temperature range. The substrate (102), piezoelectric element (106) and temperature-dependent interface structure (120) define a piezoelectric package having a predetermined non-compensated third order Bechmann curve having a low temperature end and a high temperature end, with an inflection point therebetween, whereby the frequency-temperature shift is reducable on the third order Bechmann curve.

5 Claims, 4 Drawing Sheets

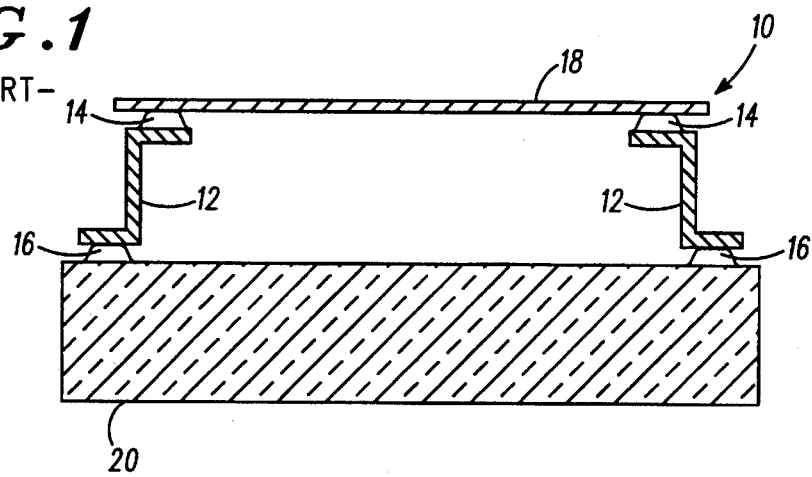
FIG. 1 -PRIOR ART-
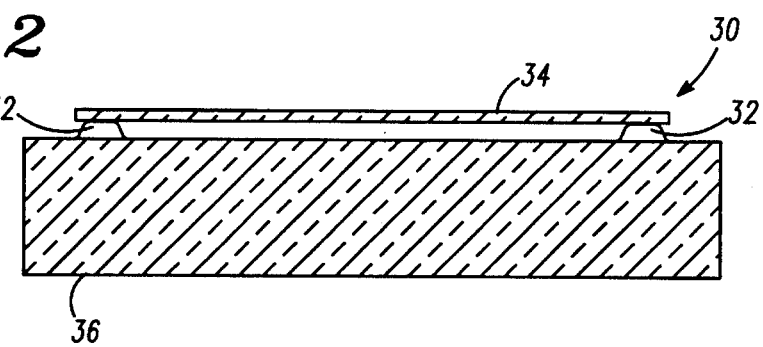
FIG. 2 -PRIOR ART-
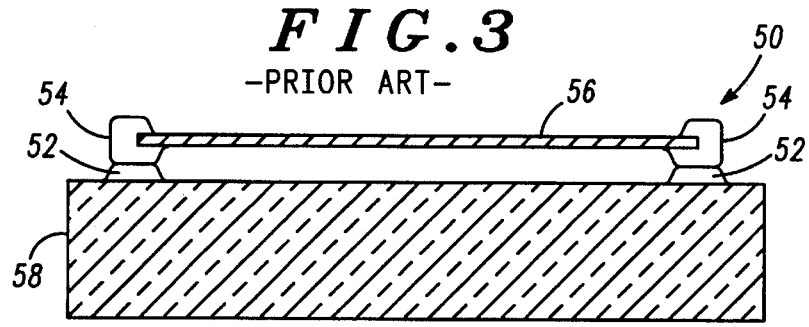
FIG. 3 -PRIOR ART-
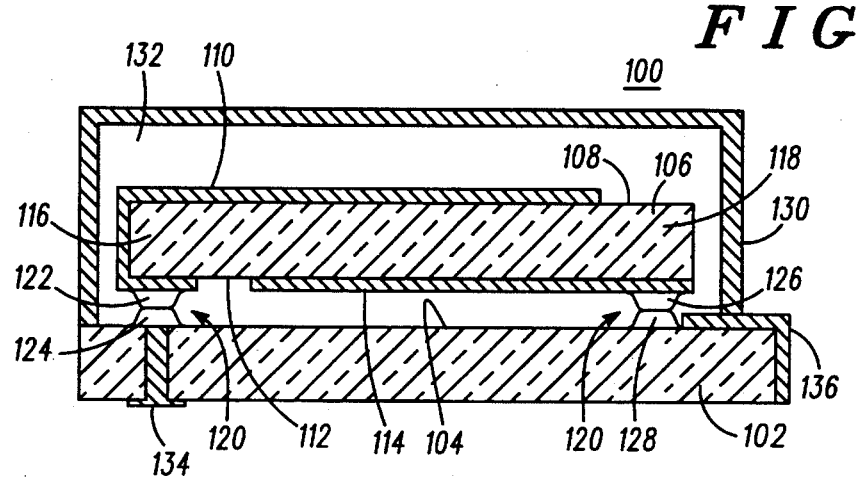
FIG. 4

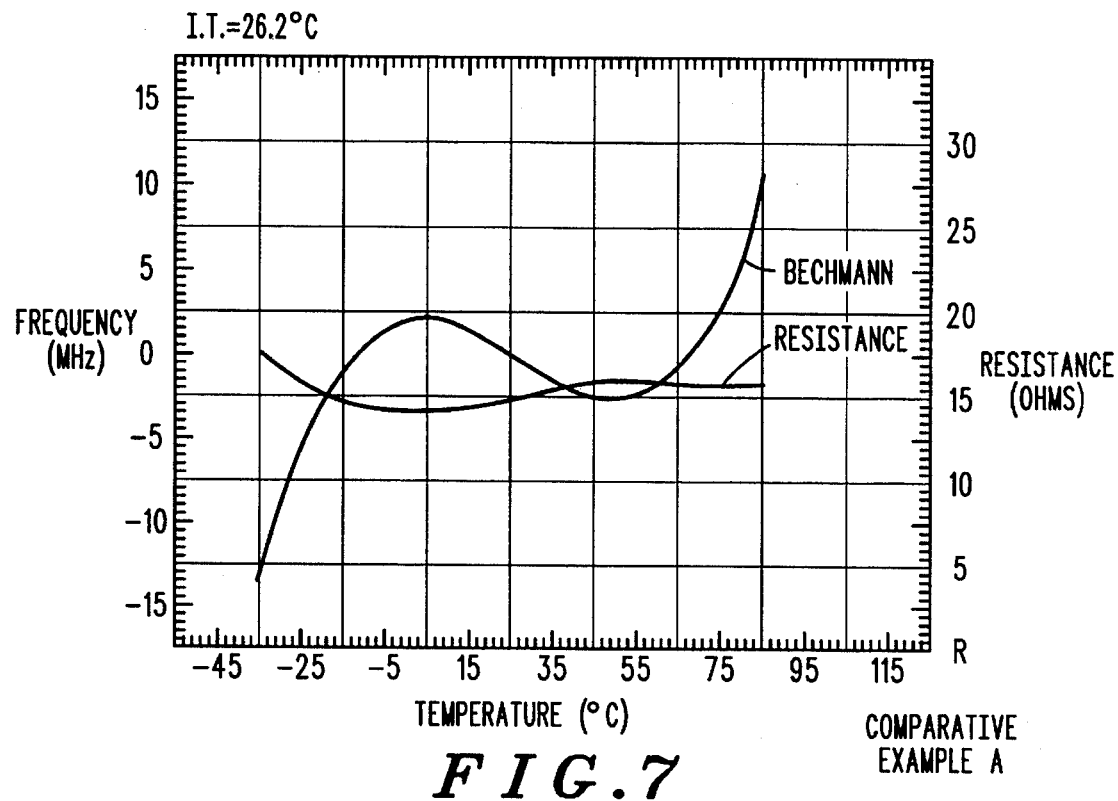
FIG.7 COMPARATIVE EXAMPLE A
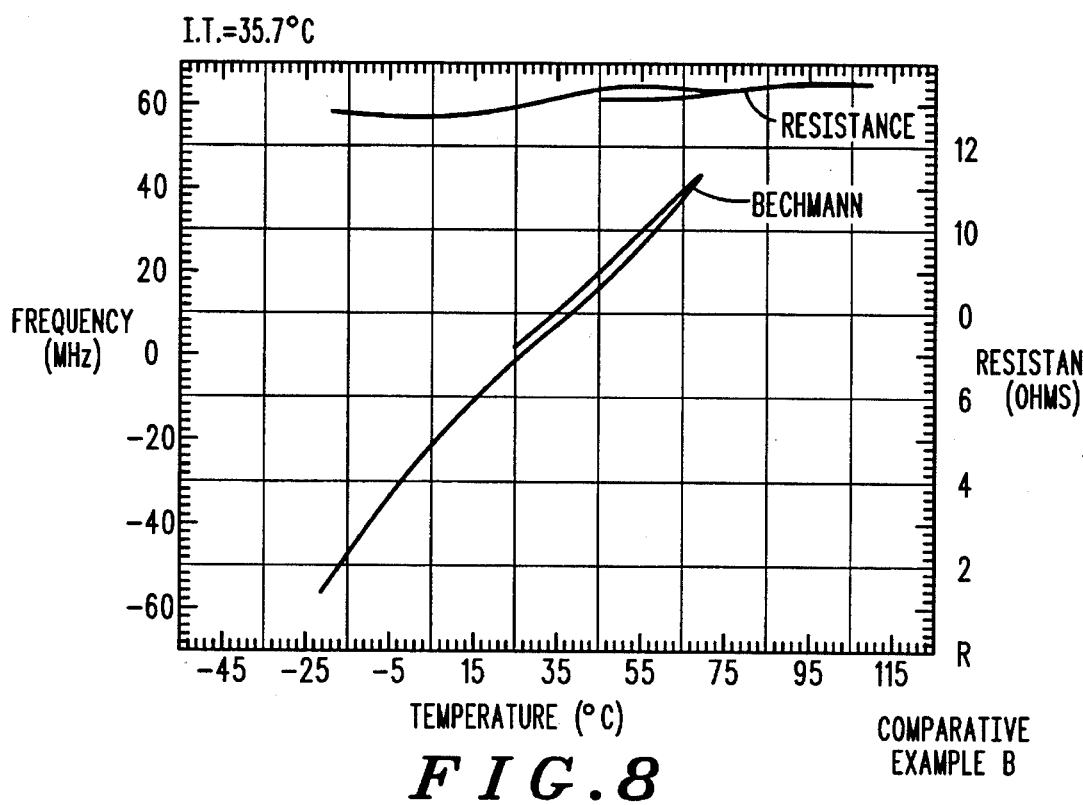
FIG.8 COMPARATIVE EXAMPLE B

COMPARATIVE EXAMPLE C

METHOD FOR REDUCING THE FREQUENCY-TEMPERATURE SHIFT OF PIEZOELECTRIC CRYSTALS

This is a division of application Ser. No. 08/268,001, filed Jun. 29, 1994 now U.S. Pat. No. 5,473,216.

FIELD OF THE INVENTION

This invention relates to piezoelectric devices, and more particularly, to a method and apparatus for selectively controlling the frequency-temperature shift of piezoelectric crystals.

BACKGROUND OF THE INVENTION

Piezoelectric devices, such as piezoelectric quartz filters, piezoelectric quartz resonators and the like, typically comprise a piece of piezoelectric material mounted to a substrate. In quartz devices, the quartz element of necessity has thin metallic electrodes attached to it through which electrical signals are coupled into and out of the piezoelectric quartz material. Common problems with piezoelectric devices are sufficiently isolating the piezoelectric devices from mechanical shock and dealing with mismatches in thermal expansion coefficients of the piezoelectric device and the substrate material.

Quite often, the components of the piezoelectric devices, such as a piezoelectric quartz material and the substrate, have different thermal expansion coefficients, this mismatch can cause mechanical stresses to be induced in the quartz during the life of these devices, as the quartz and substrate expand and contract over temperature variations. Further, mechanical shock transferred to the quartz through its mounting structure, can increase mechanical stresses that in addition to the thermal stress adversely affect the frequency and accuracy of these devices.

Various attempts over the years have been developed to mount piezoelectric quartz devices to a substrate. For purposes of this application, a compliant mount for a piezoelectric device, is a mounting device, apparatus or other mounting means that attempts to reduce or optimize mechanical stresses, on the piezoelectric quartz element.

Some prior art compliant mounting devices have used thin foil tabs that act as spring-type mounting structure that attempt to isolate the quartz element from its substrate. Other types of compliant mounting structures have attempted to use substrate materials having large thermal expansion coefficients which disadvantageously decouple the quartz from the base.

In FIG. 1, a prior art mechanical mount 10 is shown having foils 12 and epoxy bonds 14 and 16 coupling the quartz 18 and ceramic base 20. The inflection temperatures of this type of device approaches 25 degrees C. at best, and are difficult to manufacture in an automated fashion, because of such small dimensions and tight tolerances and the number of processes involved.

In FIG. 2, a second prior art rigid epoxy mount 30 is shown, which includes a rigid epoxy 32 coupling the quartz 34 and ceramic base 36 together. The inflection temperatures of this type of device are very high, such as about 30 degrees C. or higher. The quartz 34 is stressed during temperature variations, and mechanical shock resistance is minimal and frequency shifting due to these induced stresses is high.

A third prior art, silicone mount 50 is shown in FIG. 3, which includes a first conductive silicone 52 and a second layer of conductive silicone with a wraparound structure 54 coupling the quartz blank 56 with the ceramic base 58. The inflection temperature of this device approaches 28 degrees C.

Most, if not all, of the prior art compliant mounting schemes are difficult to use because of the small physical dimensions that modern piezoelectric quartz elements have. Conventional crystal oscillators using bent foil tabs to support a quartz and which are adhesively coupled by epoxy, as shown in FIG. 1, and the other prior art devices in FIGS. 2 and 3, have had marginal results, frequency shifting, increased mechanical stresses, poor shock resistance, and large unwanted frequency shifts over the temperature ranges of interest.

There is a need for an improved piezoelectric device for selectively reducing the frequency-temperature shift of piezoelectric crystals, to (i) minimize the mechanical stresses induced due to the thermal expansion mismatches between the base and crystal at a certain temperature range; (ii) provide a mechanically sufficient coupling such that the device can withstand mechanical shock; (iii) minimize frequency shifts over the temperatures of interest; (iv) provide a method of crystal attachment which is adaptable to mass production; and (v) provide a device with an inflection temperature substantially in the middle of the temperature range of interest, which can result in using quartz blanks with lower tolerances.

Accordingly, a low cost, readily manufacturable, higher quality compliant mount for a piezoelectric device would be an improvement over the prior art. A method by which quartz devices can be easily and reliably attached to a substrate and which isolates the quartz element from mechanical stresses would also be an improvement over the art.

It is also considered an improvement over the art to be able to make a low cost, high quality and readily manufacturable piezoelectric device with controllable temperature-frequency shifts over a temperature range of interest.

BRIEF DESCRIPTION DRAWINGS

FIG. 1 shows a cross-sectional view of a prior art mechanical mount crystal oscillator.

FIG. 2 shows a second prior art crystal oscillator which includes rigid epoxy which couples the quartz blank to a ceramic base.

FIG. 3 shows a third prior art crystal oscillator with a conductive silicone coupling a quartz blank to a ceramic base.

FIG. 4 shows a cross-sectional view of an embodiment of an improved piezoelectric device for reducing the frequency-temperature shift of piezoelectric crystals, in accordance with the present invention.

FIG. 7 is a plot of the frequency resistance response over temperature of the prior art oscillator in FIG. 1 in connection with Comparative Example A.

FIG. 8 is a plot of the frequency and resistance response over temperature of the prior art oscillator in FIG. 2 in connection with Comparative Example B.

DETAILED DESCRIPTION OF THE PREFERRED EMBODIMENT

Figure 5:
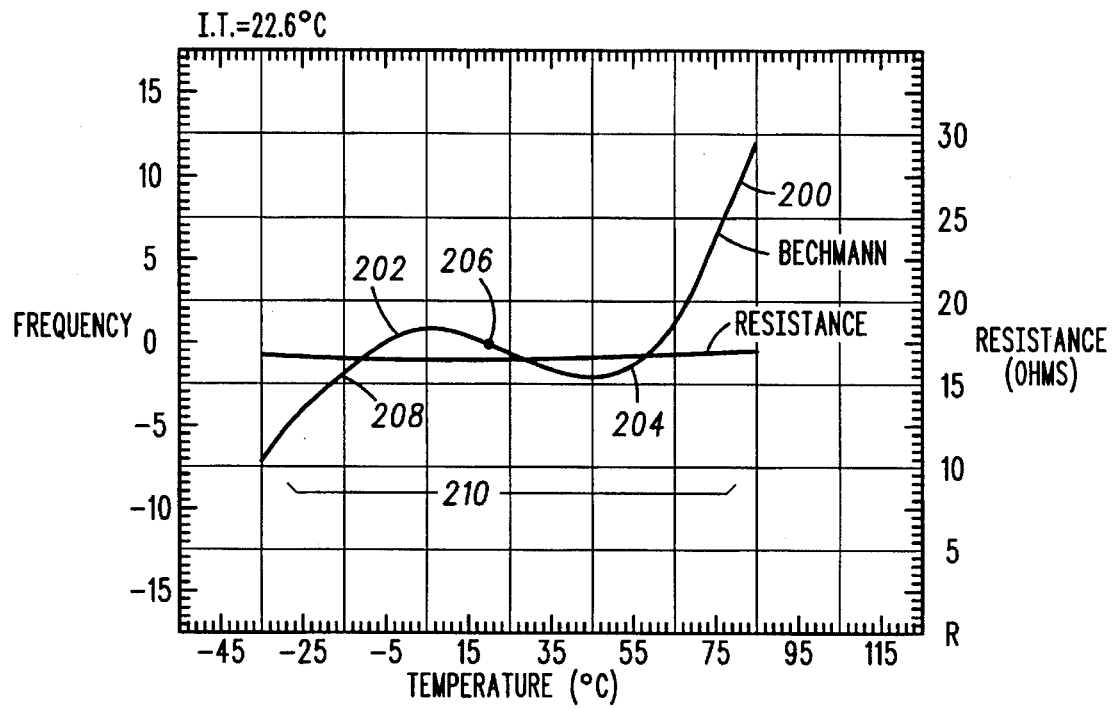
FIG. 5 shows a plot of the frequency, temperature and resistance response of a preferred piezoelectric device shown in FIG. 4, in accordance with the present invention.

Generally, FIG. 4 shows a cross-sectional view of a piezoelectric device 100. The piezoelectric device is particularly adapted to reducing the frequency-temperature shift of piezoelectric crystals in a predetermined temperature range. The piezoelectric device 100 generally includes a substrate, a piezoelectric element and a temperature dependent interface structure for beneficially stressing the piezoelectric element at a predetermined temperature range, whereby the frequency-temperature shift is reduced on the non-compensated third order Bechmann curve, as shown for example in FIGS. 4 and 5.

In more detail, the piezoelectric device 100 includes a substrate 102 having at least one upwardly facing planar surface 104. The device 100 also includes a piezoelectric element 106 having an upwardly facing surface 108 and a top electrode 110 and a downwardly facing surface 112 with a bottom electrode 114, and a left side 116 and a right side 118. The device 100 further includes a temperature dependent interface structure 120 for beneficially stressing the piezoelectric element at a predetermined temperature range. The interface structure 120 comprises a substantially conductive and compliant material coupling the left and right sides 116 and 118 of the piezoelectric element 106 with the substrate 102. This structure provides the electrical connections for actuating the device. The substrate 102, piezoelectric element 106 and temperature dependent interface structure 120 defines a piezoelectric package having a predetermined non-compensated third order Bechmann curve having a low temperature end and a high temperature end, with an inflection point therebetween, whereby the frequency-temperature shift is reducible (and/or controllable) on the third order Bechmann curve. More particularly, in FIG. 5, a non-compensated third order Bechmann curve is show as item 200. The third order Bechmann curve 200 includes a low temperature end 202, a high temperature end 204 and an inflection point 206 between the low and high temperature ends 202 and 204. Item 208, can be considered a substantially linear area in the low temperature end 202, which provides a beneficial or positive stress to the piezoelectric element 106, to reduce (or control) the frequency-temperature shift in that area, as detailed below.

The device 100 utilizes a temperature dependent interface structure 120, preferably an epoxy, which has a glass transition temperature in the temperature range of interest and a modulus of elasticity which reduces coupling between the piezoelectric element 106 and the substrate 102 under certain conditions. The piezoelectric device 100 is processed in such a way that the frequency shift over temperature is controllable, preferably at the low temperature end, and the resulting devices possess lower inflection temperatures than those of the prior art, as detailed herein. In the prior art, the Bechmann curve drops more rapidly on the cold end of the temperature spectrum than that shown in FIG. 5. In FIG. 5, the low temperature end (cold end) 202 of the Bechmann curve 200 has been flattened and approaches a more linear curve, at linear area 208, resulting in a tighter tolerance device with a lower inflection temperature. With these features, the yields of the end product (piezoelectric device 100), can be improved, and additionally, a wider range of incoming wafer angles (elements 106) can be used, which can result in less waste or scrap in the front end operations, in the manufacture of crystals.

The temperature dependent interface structure 120 can have a glass transition temperature which ranges widely. In a preferred embodiment, the glass transition temperature ranges from about −35 degrees C. to about 85 degrees C., more preferably ranging from about 50 degrees C. to about 80 degrees C. for including the higher temperatures of typical customer specifications, while also flattening or making a portion of the low end 202 of the Bechmann curve 200 more linear, and most preferably about 60 degrees C. to about 72 degrees C., for reducing the slope, controlling and flattening the low temperature end 202 of the Bechmann curve 200.

The glass transition temperature of the temperature dependent interface structure 120 is dependent on several factors, such as the curing profile, material and chemistry.

The glass transition temperature (sometimes referred to as the $T_g$), is defined as the point where above this temperature, the material can be described as being substantially a liquid and below this temperature the material can be described as being substantially a glass. The material becomes a glass if the liquid being cooled reaches a viscosity of about $1 \times 10^{13}$ poise. As used in this application, the $T_g$ is the point at which the temperature dependent interface structure 120, and preferably the epoxy's characteristics undergo a change. Below this temperature the viscosity increases and the coefficient of thermal expansion decreases. And, conversely, above this temperature the viscosity decreases and the coefficient of thermal expansion increases.

In a preferred embodiment, the structure 120 includes a beneficial (positive) stress at the low end due to the desired characteristics of this structure, which results in causing flattening of the curve 200 at the low end 202, advantageously resulting in lowering the inflection temperature in FIG. 5, thereby moving the inflection temperature down and toward the middle of the temperature range of interest. This allows a piezoelectric crystal to be made which can have tighter tolerances, utilize less exact crystal wafers and provide higher yields.

In a preferred embodiment, the non-compensated third order Bechmann curve is substantially as shown in FIG. 5. In one application, for example, the behavior of the third order Bechmann curve of interest in FIG. 5, ranges from about −35 degrees C. to about 85 degrees C. Preferably, the third order Bechmann curve 200 includes at least a partially linear section in the low temperature end 202, below the inflection point 206, as shown by linear area 208, for example.

The linear area 208 has a decreased or smaller slope, than prior art techniques and apparatus's known to the inventors. The advantages of this flattening at the low temperature end 202 of the curve is that a decreased frequency shift as a function of temperature is provided, which results in better controllability of the device 100, and a larger wafer (piezoelectric element 106) angle range or less precisely cut crystals can be used, which can increase the front end yields in the manufacture of crystals. Another advantage of device 100, is that the inflection temperature is lowered, which thereby substantially centers the Bechmann curve within many customer's specifications, which can result in substantial increases in manufacturing yields, because the Bechmann curve is more centered in the temperature range of interest. This can decrease the number of out of specification devices.

The piezoelectric package, defined by at least the substrate 102, piezoelectric element 106 and temperature-dependent interface structure 120, and in a preferred embodiment, a cover or lid 130, includes an inflection temperature substantially in the middle of the temperature range of interest on Bechmann curve 200.

With the inflection temperature lowered and located substantially in the middle of the temperature range of interest on the Bechmann curve, the manufacturing yields can be increased, within many customer specifications, because the high and the low ends are less dramatic because of the centering of the Bechmann curve and centering of the inflection temperature 206. This can result in substantial manufacturing yield improvements.

In one embodiment, the inflection temperature (or inflection point 206) is about 25 degrees C. or less, and preferably ranges from about 21 degrees C. to about 23 degrees C. for improved quality and manufacturing yields.

The piezoelectric element 106 can comprise a number of different types of crystals, such as but not limited to, AT cut quartz crystals, BT, CT and DT as well.

In a preferred embodiment, the piezoelectric element comprises an AT cut quartz crystal for the desired frequency response, similar to that shown in FIG. 5.

The AT cut quartz crystal can be cut in a variety of ways, and in a preferred embodiment, it is cut at about 35 degrees relative to a Z axis thereof. Cuts slightly above or below this value can result in crystals which suffer from frequency instability over temperature. With an AT cut quartz crystal, the first order coefficient is substantially or nearly zero, so frequency change over temperature is decreased or minimized.

In a preferred embodiment, the piezoelectric device 100, includes a substrate 102 having at least one substantially upwardly facing planar surface 104; a piezoelectric element 106 having an upwardly facing surface 108 including a top electrode 110 and a downwardly facing surface 112 including a bottom electrode 114, and a left side 116 and a right side 118; a temperature dependent interface structure 120 for beneficially stressing the piezoelectric element 106 at a predetermined temperature range, comprising a substantially conductive and compliant adhesive material bonding the left and right side 116 and 118 of the downwardly facing surface 112 of the piezoelectric element 106 with the substrate 102, the interface structure having a glass transition temperature ranging from about 60 degrees C. to about 72 degrees C.; the substrate 102, piezoelectric element 106 and temperature dependent interface structure 120 define a piezoelectric package having a predetermined non-compensated third order Bechmann curve having a low temperature end and a high temperature end, with an inflection point therebetween, the interface structure 120 being more compliant above the glass transition temperature than below the glass transition temperature, defining a beneficially stressed piezoelectric element which has a substantially reduced and at least partially controllable frequency-temperature shift at the low temperature end of the non-compensated third order Bechmann curve. This embodiment provides higher quality, improved manufacturing yields and can provide lower costs, as compared to the prior art.

In a preferred embodiment, the piezoelectric package includes an inflection temperature of about 25 degrees C. or below and the temperature dependent interface structure 120 comprises a glass transition temperature between about 60 degrees C. and about 72 degrees C., for providing a means of controlling (reducing) the frequency-temperature shift on the low temperature end 202 of the temperature range of interest, in order to produce a tighter tolerance crystal.

Also in a preferred embodiment, the piezoelectric element comprises an AT cut quartz crystal, for improved manufacturability and frequency control over the temperature range of interest.

The temperature dependent interface structure 120 can comprise a wide range of materials so long as it provides the required properties, as detailed herein.

The term "compliant" as used herein, includes its normal dictionary meaning of being ready or disposed to comply. For example, a compliant material as used herein, includes a certain threshold resilience or ability to yield elastically when a force is applied without degrading, and desirably is conformable, adaptable, pliable and flexible upon suitable forming or curing. The temperature dependent interface structure 120 includes many if not all of these desirable characteristics.

For example, a suitably formed and cured temperature dependent interface structure 120 can move horizontally for the shrinking and expanding of the piezoelectric element 106 with respect to the substrate 102, due to the differences in the coefficient of expansion. Thus, minimal stresses are provided to the piezoelectric element 106 at desired temperature ranges, such as from 50 to 100 degrees C., and the interface structure 120 improves shock resistance and provides dynamic movement as needed, for expansion and contraction of he piezoelectric element and substrate 106 and 102, respectively. These features and structures are considered an improvement over oscillators using metallic foils, certain other epoxies and other materials which do not have these features.

The temperature dependent interface structure 120 provides an electrical signal path to the top wrap around electrode 110 and bottom electrode 114. The temperature dependent interface structure 120 thus provides a first signal path provided by a top dollop 122 and bottom dollop 124 to the first exterior connection 134 and a second signal path on the right side 118 of the top and bottom dollops 126 and 128 to the second external connection 136, for suitable external connection to a circuit, circuit board or the like.

The temperature dependent interface structure 120 can comprise a number of materials so long as the material has the desired properties, compliance, conductivity, glass transition temperature and the like. Some examples of these materials can include conductive epoxies and adhesives.

In a preferred embodiment, the material includes a conductive epoxy for the following reasons. This material should be curable over a wide temperature range, and after suitable curing be sufficiently compliant yet have a certain threshold resilience. In one embodiment, the material includes a lower viscosity conductive epoxy, model #976-5, which can be obtained from Ablestik, 20021 Tusana Road, Rancho Dominguez, Calif. 90221.

This epoxy includes a conductive material, which includes a gold or silver powder which percentage by weight can range widely. In a preferred embodiment, the epoxy includes a silver powder content ranging from about 65% by weight to about 80% by weight, the lower range being sufficient to attain the desired conductivity and the upper range being limited so as to minimize any adverse affects on the adhesive properties, and most preferably about 75% to about 80%, for minimizing resistance and being processable and reproducible for manufacturing crystals.

The resistance of the temperature dependent interface structure 120 can vary widely. In a preferred embodiment, the Volume Resistivity is lower than about $10 \times 10^{-3}$ ohms-cm, to provide a good electrical connection and low power consumption, and preferably is about $7\times10^{-5}$ ohms-cm or less (in accordance with Test Method, VR-1), for remaining within certain specified tolerances. For example, when the piezoelectric device 100 is used as an oscillator for certain pagers, if the resistance is above a certain threshold of for example 100 ohms, the pager may not operate.

In a preferred embodiment, the temperature dependent interface structure 120 comprises the silver-filled epoxy which is suitably cured to form a compliant gel of material that couples the piezoelectric element 106 with the substrate 102. This material provides for improved cushioning and isolation from mechanical shock, and further provides suitable elasticity to allow expansion and contraction, with minimal stress to the piezoelectric element 106 over certain temperature ranges. Further, this material provides a beneficial or positive stress to the piezoelectric element 106 at a desired (different) temperature range, for example, to provide a linear portion of the curve near linear area 208, for the reasons detailed above.

Accordingly, the way in which the piezoelectric device 100 is made and the way the temperature dependent interface structure 120 is cured, is important to obtain the desired characteristics and properties. Thus, the method of mounting the piezoelectric element is important so that the interface structure 120 will have sufficient compliance and conductivity, and desirably couple the piezoelectric element and substrate, both mechanically and electrically, to allow the piezoelectric element 106 and the substrate 102 to move over various temperatures; minimize shock transfer; minimize outgassing; minimize electrical resistance; and minimize unwanted frequency shifts over a wide temperature range; and optimize the inflection temperature to substantially the middle of the temperature range of interest.

Figure 6:
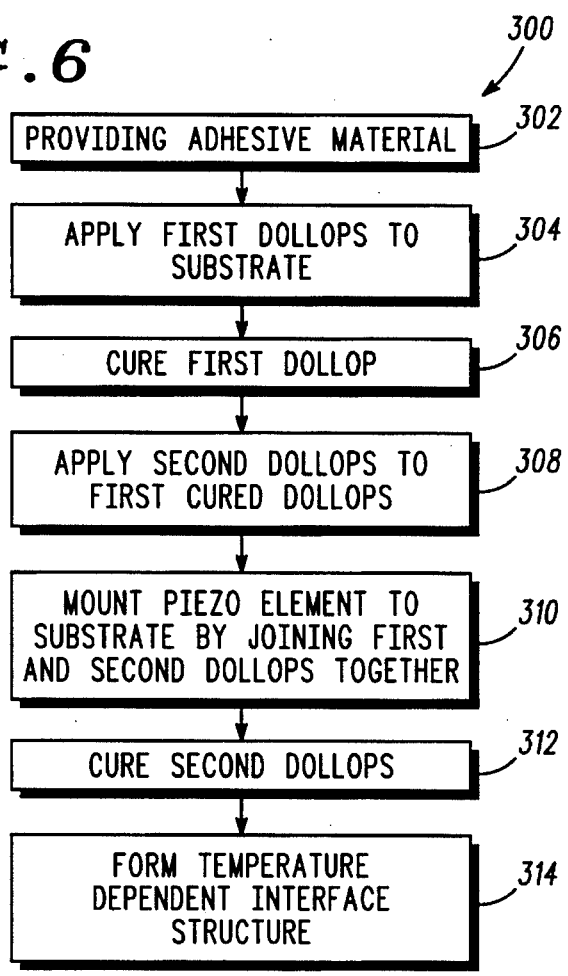
FIG. 6 is a block diagram of a method of mounting a piezoelectric element with a substrate, in accordance with the present invention.

In FIG. 6, a block diagram of a method of mounting a piezoelectric element with a substrate is shown. More particularly, a method of compliantly mounting a piezoelectric element with a substrate having an upwardly facing surface to which the piezoelectric element is to be attached, is shown.

Referring to FIGS. 4 and 6, a preferred method comprises the following steps. First, a viscous conductive adhesive material is provided in block 302. Preferably, the material includes epoxy and a conductive material, as detailed herein. Next, a first application step 304 is shown, which includes applying first, uncured dollops of the viscous conductive adhesive material onto selected places on the upwardly facing surface of the substrate. The next block is a first curing step 306, which includes curing the first, uncured dollops of the viscous conductive adhesive material to form first cured dollops of compliant, conductive material coupled to the substrate 120 and 128. The next block is a second application step 308, which includes applying second uncured dollops of the viscous conductive adhesive material 122 and 126 onto the first cured dollops of compliant conductive material 124 and 128, respectively. The next step is a mounting step 310, which includes mounting the piezoelectric element 106 onto the second uncured dollops of compliant conductive material 122 and 126. The next step involves block 312, which includes a second curing step, of curing the second uncured dollops of the viscous conductive adhesive material 122 and 126. And, the bottom block is a forming step 314, which includes forming a temperature dependent interface structure 120 comprising the first and the second cured dollops of the viscous conductive adhesive material, whereby a piezoelectric package defined by the substrate, the piezoelectric element and the temperature dependent interface structure is tunably adjustable to reduce (or control) the frequency-temperature shift of the non-compensated third order Bechmann curve, substantially as shown and as detailed previously in connection with FIG. 5. This method provides an improvement in the manufacture of crystals over mechanical mounts and certain silicone structures known to the inventors, and can provide higher quality crystals. Further, the interface structure 120 in a preferred embodiment, comprises two epoxy dollops (or stacked dollops) for a lower inflection temperature, and linear area 208, for improved manufacturing yields and tighter tolerances, if desired.

In more detail, the application steps 304 and 308 include precise and selective application of the adhesive material such that only the outer portions (or the inactive region) of the piezoelectric element 106 are contacted with material. Also, the material should be dispensed in a substantially void free manner for suitable connection and adhesion, and in a sufficient amount to provide a cushioning interface and minimizing resistance.

In connection with the application steps 304 and 308 and mounting step 310, the rheology of the material can be very important. If the uncured material is exceedingly viscous, it will flow uncontrollably to unwanted places prior to curing, and if it is too thick, it will be difficult to dispense to the desired location.

Desirably, the uncured adhesive material should bond firmly to the application site, while being able to support the piezoelectric element 106 after the mounting step 310. In this embodiment, the material includes a viscosity of about 15 kcps (in accordance with test method VM-2), and preferably a viscosity of about 15 kcps to about 30 kcps, this range being governed by providing a suitable consistency adapted for simplifying application and providing good adhesive properties. The viscosity of the uncured material should be such that it can be dispensed manually or preferably, in an automated fashion with a robot for example, for improved mass production.

The thixo index of the uncured material can vary widely. The thixo index as used herein is the ratio of two viscosities (test method TI-1). In a preferred embodiment, the thixo index (ratio) is selected such that the material will sufficiently stick or bond to the surface it is applied to. In a preferred embodiment, the thixo index ranges from about 2 to about 4, and most preferably about 2 to about 3.5, the lower limit being governed by the ability to support the piezoelectric element prior to cure and the upper limit being governed by simplifying dispensing of the material.

Also in a preferred embodiment, the application steps 304 and 308 involve applying or dispensing a substantially void-free and sufficient amount of material, to provide a suitable mechanical and electrical connection (or bond line) with the desired properties and characteristics.

In a preferred embodiment, the curing steps 306 and 312 can vary widely. Generally, these steps include subjecting the uncured viscous adhesive material to a predetermined temperature for a predetermined time to form a temperature dependent interface structure 120, having the desirable characteristics and properties, as detailed herein.

More particularly, when the temperature dependent interface structure 120 includes the desired epoxy, Ablestik's model #976-5, the curing steps 306 and 312 include curing in a hot air oven at about 80 degrees C. to about 180 degrees C., and preferably about 150 degrees C. for a substantially complete cure, for a duration of about 30 minutes to about 4 hours, and preferably about 2 hours (depending on the application), for minimizing outgassing of the material and improved integrity. In a preferred embodiment, the temperature dependent interface structure 120 comprises first and second stacked dollops which each require curing at about 150 degrees C. for one hour, for providing a complete cure, good adhesion to the desired adhesive sites and decreased resistance.

In still more detail, when suitably cured and as set forth with regard to steps 306 and 312, the adhesive material provides a soft and jelly-like support and coupling, which allows the piezoelectric element 106 to float with respect to the substrate 102, and which becomes less compliant at certain temperature ranges, for beneficially stressing the piezoelectric element for reducing the frequency-temperature shift at certain low temperatures, as substantially shown in the Bechmann curve in FIG. 5. The temperature dependent interface structure 120, if appropriately cured, will provide a substantially stress free state at the high temperature end 204 and a beneficially stressed state at the low temperature end 202, to obtain the desired results, such as lowering the inflection temperature and obtaining the desired linear area 208.

In addition to the curing steps, a post-cure conditioning step can be included. It is believed that a high temperature conditioning step can further minimize outgassing of the temperature dependent interface structure 120 and promote cross-linking of the material with the bond sites and itself.

The regimen pertaining to the curing and forming steps is important to achieve the desired compliance in one embodiment, the temperature dependent interface structure 120 has a compliance, as measured by Young's Modulus which can vary widely. The Young's Modulus should involve a suitable range such that it does not have an excessive amount of rigidity and is not excessively low so that an interface with sufficient integrity for withstanding mechanical shock is formed. In one embodiment, the Young's modulus is about $10 \times 10^5$ N/m$^2$ or less, and preferably about $3 \times 10$ N/m$^2$ or less, for improved compliance and minimal stress in the substantially unstressed state.

In the unstressed or substantially minimally stressed state, the inflection temperature is about 26 degrees C., which is not centered in the desired temperature specifications and temperature range of interest. With the beneficially or positively stressed state, the inflection temperature substantially approaches the middle of the temperature range of interest, for improved yields and tighter tolerances if desired. In addition, the beneficially stressed state provides a flattening or improved linearity of the linear area 208 at the low end temperature 202 of the temperature spectrum of interest, also for improving manufacturing yields, the ability to use less stringent tolerances for the crystal blanks, and tighter tolerance crystals (products), if desired. The coefficient of thermal expansion is about $400 \times 10^{-6}$ ppm/° C. (hereafter ppm/° C.) above the glass transition temperature, and $100 \times 10^{-6}$ ppm/° C. below the glass transition temperature. Preferably, the coefficient of thermal expansion is about $390 \times 10^{-6}$ above $T_g$, and $73 \times 10^{-6}$ below $T_g$, for obtaining the desired control, linearity and minimized slope at the low end 202. As detailed herein, this can contribute to substantially higher manufacturing yields of crystals.

The present method is particularly adapted for use in the manufacture of crystal oscillators, and most particularly adapted for mass production thereof. In more detail, a preferred method can include the following steps. 1) Providing a substrate comprising a ceramic material, with a suitable metallic scheme 134 and 136 for providing electrical signals. 2) Dispensing a dollop 124 and 128 of a silver-filled epoxy, Ablestik's model number 976-5, at suitable positions for bonding to the first and second connections 134 and 136. A sufficient amount of the material is dispensed to form a good bond site. Preferably, it is void-free to give a good connection and improved cushioning upon cure. 3) Curing the silver-filled epoxy such that a compliant interface is formed. 4) Dispensing a second set of dollops 122 and 126 on top of the first dollops 124 and 128, respectively. 5) Mounting and aligning a piezoelectric element 106 such that the uncured dollops contact the electrodes 110 and 114, respectively. 6) Curing the second dollops 122 and 126 such that a compliant interface is formed between the piezoelectric element 106 and substrate 102. Preferably, curing is accomplished by placing the device 100 into a hot air oven, such as a Blue M oven, in Blue Island, Ill., model nos. POM-586A-2 and POM7-1463-3, for a sufficient time and at a sufficient temperature. When a preferred silver-filled epoxy is used, Ablestik's model number 976-5, each curing time in items 3 and 6, include one hour at 150 degrees C. It is believed that this curing protocol, will appropriately provide good cross-linking of the material to itself and to the bond sites as well, while minimizing the chance of any outgassing. 7) Frequency tuning the piezoelectric element by depositing metal onto an exposed surface, preferably the top electrode 110. 8) Seam welding the lid, preferably a metallic lid 130 to the substrate, to form a hermetic environment surrounding the piezoelectric element 106. As previously stated, this method is particularly adapted for mass production purposes, however, this method can be accomplished by manual means as well.

EXAMPLES

The following examples serve to give illustrations of the practice of this invention, and are not intended in any way to limit the scope of this invention.

Comparative Example A

A piezoelectric crystal was coupled to a conventional two foiled mounting structure, substantially as shown in FIG. 1. In more detail, a total of two dollops of silver-filled rigid epoxy were placed on the substrate and the metal foil was placed within each epoxy dot. This epoxy was model number C990 available from Emerson & Cumings, Boston, Mass. The assembly was then cured for one hour at 180 degrees C. A second dollop of epoxy was placed on top of each of the metal foils and the crystal was positioned above the fresh epoxy dots. The electrode of the crystal was in contact with the epoxy, but the active area of the crystal was free from the epoxy. The crystal in FIG. 1 was then cured a second time at 180 degrees C. for an hour. Thereafter, the crystal was subjected to a high temperature profile for 10 minutes at 360 degrees C. Next, the units were sealed, and tested for frequency as a function of temperature. Approximately 40 units were made as described herein. An example taken from substantially the mean of these 40 units, is illustrated in FIG. 7. The inflection temperature for this unit was 26.2 degrees C., which is comparable to that obtained from a piezoelectric device in a stress free environment. Even though this design eliminates stress, the resulting inflection temperature is undesirably high and the manufacturability of this product is time consuming and difficult.

Comparative Example B

A piezoelectric crystal oscillator was made substantially as shown in FIG. 2. In this example, a piezoelectric crystal was coupled to the substrate through use of a rigid silver-filled epoxy. This epoxy was model number C990 available from. Emerson & Cumings, Boston, Mass. Epoxy dollops were placed on the left and right side of the substrate, and were used to hold the crystal blank in place with respect to the substrate. The entire assembly was cured at 180 degrees C. for one hour. This crystal had a very large Bechmann curve slope and high frequency instability. The inflection temperature was at 35.7 degrees C. This design would be very difficult to manufacture and produce a high quality product. Forty units were made in this manner. The substantially mean example is shown in FIG. 8, and as described herein.

Comparative Example C

At least 300 crystals were made substantially as shown and described in connection with FIG. 3. The specific results below are taken from a substantially mean example.

Figure 9:
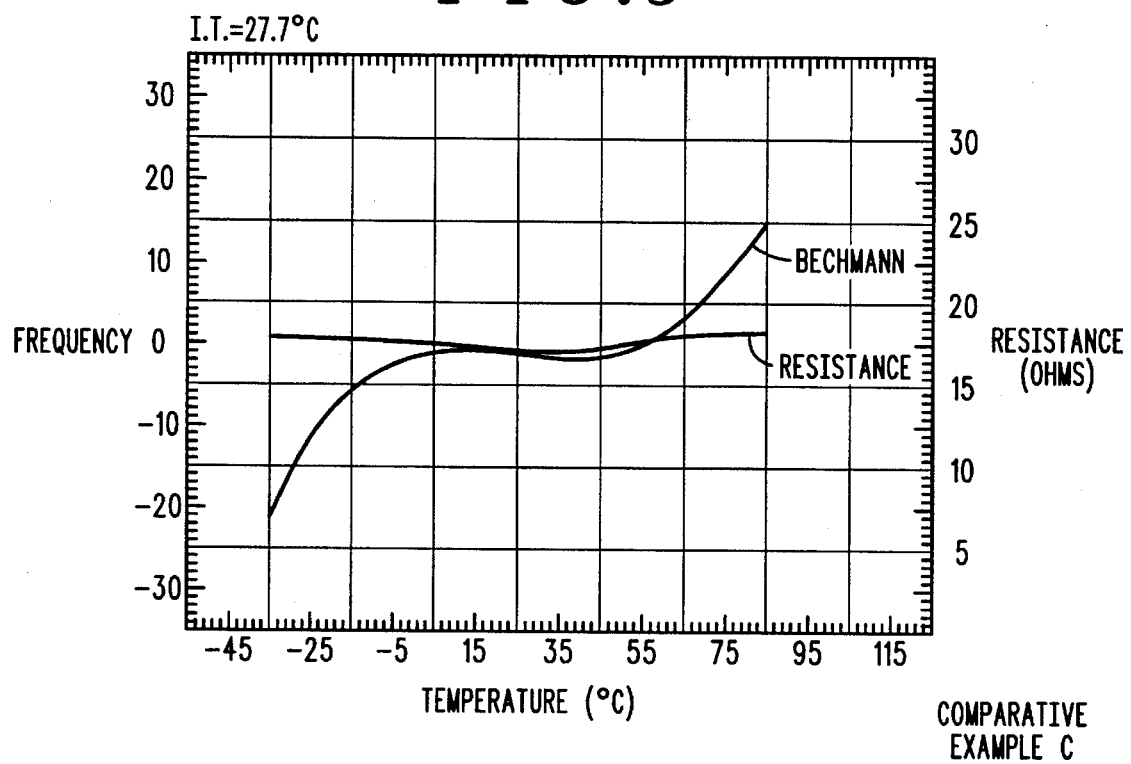
FIG. 9 is a plot of the frequency and resistance response over temperature of the prior art oscillator shown in FIG. 3 in connection with Comparative Example C.

In Comparative Example C, the piezoelectric crystal was coupled to the substrate using a silicone adhesive. This adhesive is known as LE-3355 available from Grace, Inc. in Boston, Mass. The first adhesive dollops were placed on either side of the substrate, and cured for one hour at 150 degrees C. After cure, second adhesive dots were placed upon each of the first dots, and the crystal was set on top of the dots. The adhesive was wrapped around the blank, in order to assure conductivity of the silicone. The entire assembly was then cured for one hour at 150 degrees C. These crystals were then run over a high temperature profile for 10 minutes at 360 degrees C. When these units were run over the temperature test for frequency, the resulting inflection temperature was as shown in FIG. 9, to have a value of 27.7 degrees C. This inflection temperature is undesirably high, as in Comparative Example B, which results in a higher number of units falling out of the desired specifications at the low end of the temperature range.

Example 1

Approximately 40 piezoelectric devices were made substantially as shown and described in FIG. 4. The frequency-temperature plot of a device taken substantially from the mean of these 40 units is shown in FIG. 5.

More particularly, the piezoelectric crystal was coupled to the substrate with a flexible epoxy known as Ablestik's model number 976-5. A first set of dots were placed on either side of the top surface of the substrate. This portion of the design was then cured for two hours at 150 degrees C. Next, second dollops were placed on each initial dot and the crystal was placed on top of these dollops. Next, a second cure was accomplished by subjecting the device for two hours at 150 degrees C. in a Blue M oven. Thereafter, the assembly underwent a high temperature profile for five minutes at 300 degrees C. Next, the units were sealed. A frequency vs. temperature plot is as shown in FIG. 5. Here, the inflection temperature is 22.5 degrees C., which is substantially in proximity to the center of the desired temperature range. In addition, the low end of the temperature range includes a flattening of the curve, which provides a higher quality product, that can be made with higher tolerances and can be more easily manufactured than the prior art. Another advantage of Example 1, is that the resistance plot as shown in FIG. 10 is substantially linear over the temperature range of interest.

Although various embodiments of this invention have been shown and described, it is to be understood that various modifications and substitutions, as well as rearrangements and combinations of the preceding embodiments, can be made by those skilled in the art, without departing from the novel, spirit and scope of this invention.

What is claimed is:

1. A method of compliantly mounting a piezoelectric element onto a substrate having an upwardly facing surface to which the piezoelectric element is to be attached, the method comprising the steps of:

providing a viscous conductive adhesive material comprising epoxy and a conductive material;

applying first, uncured dollops of the viscous conductive adhesive material onto selected places on the upwardly facing surface of the substrate;

curing the first, uncured dollops of the viscous conductive adhesive material to form first cured dollops of compliant, conductive material coupled to the piezoelectric element;

applying second uncured dollops of the viscous conductive adhesive material onto the first cured dollops of compliant conductive material;

mounting the piezoelectric element including a bottom electrode and a wraparound top electrode onto the second uncured dollops of compliant conductive material;

curing the second uncured dollops of the viscous conductive adhesive material, thereby forming a temperature dependent interface structure comprising the first and the second cured dollops of the viscous conductive adhesive material having a predetermined glass transition temperature; and providing a piezoelectric package defined by the substrate, the piezoelectric element and temperature dependent interface structure having a non-compensated third order Bechmann curve with a low temperature end and a high temperature end with the interface structure being more compliant in proximity to and above the glass transition temperature than below, whereby a beneficially stressed piezoelectric element is provided which has a substantially reduced frequency temperature shift at the low temperature end of the third order Bechmann curve due to a reduced compliance of the interface structure below the glass transition temperature.

2. The method of claim 1, wherein both curing steps include exposing the first and second uncured dollops of the viscous conductive adhesive to a sufficient temperature to encourage cross-linking and release of volatiles.

3. The method of claim 1, wherein the first curing step includes subjecting the first, uncured dollops of the viscous conductive adhesive material to a temperature ranging from about 80 to about 180 degrees C. for about 1 hour to about 4 hours.

4. The method of claim 1, wherein the second curing step includes subjecting the second, uncured dollops of the viscous conductive adhesive material to a temperature ranging from about 80 to about 180 degrees C. for about 1 hour to about 4 hours.

5. The method of claim 1, wherein at least one or both of the applying steps include:

selecting the uncured material which is adapted to adhere to the immediate area it is dispensed on or to; and choosing the uncured material such that it has a consistency adapted to support the weight of the piezoelectric element prior to being formed.

* * * * *